(12) United States Patent
Wang

(10) Patent No.: US 10,867,165 B2
(45) Date of Patent: Dec. 15, 2020

(54) CUSTOM GESTURE COLLECTION AND RECOGNITION SYSTEM HAVING MACHINE LEARNING ACCELERATOR

(71) Applicant: KaiKuTek INC., Taipei (TW)

(72) Inventor: Mike Chun Hung Wang, Taipei (TW)

(73) Assignee: KaiKuTek INC., Taipei (TW)

( * ) Notice: Subject to any disclaimer, the term of this patent is extended or adjusted under 35 U.S.C. 154(b) by 206 days.

(21) Appl. No.: 16/264,541

(22) Filed: Jan. 31, 2019

(65) Prior Publication Data

US 2019/0243458 A1 Aug. 8, 2019

Related U.S. Application Data

(60) Provisional application No. 62/626,147, filed on Feb. 4, 2018.

(51) Int. Cl.
*G06F 3/01* (2006.01)
*G01S 7/41* (2006.01)
(Continued)

(52) U.S. Cl.
CPC .......... *G06K 9/00335* (2013.01); *G01S 7/414* (2013.01); *G01S 7/417* (2013.01); *G01S 13/584* (2013.01); *G01S 13/89* (2013.01); *G06F 3/017* (2013.01); *G06F 9/5027* (2013.01); *G06F 17/18* (2013.01); *G06K 9/2018* (2013.01); *G06K 9/4628* (2013.01); *G06K 9/6215* (2013.01); *G06K 9/6256* (2013.01); *G06K 9/6259* (2013.01); *G06K 9/6262* (2013.01); *G06K 9/6267* (2013.01); *G06K 9/6271* (2013.01); *G06N 3/08* (2013.01); *G06N 20/00* (2019.01); *G06T 7/20* (2013.01); *H03B 21/02* (2013.01); *G01S 7/415* (2013.01); *G01S 13/50* (2013.01); *G01S 2007/356* (2013.01); *G06T 2207/10028* (2013.01); *G06T 2207/20056* (2013.01); (Continued)

(58) Field of Classification Search
CPC ... G06F 3/01; G06F 3/017; G01S 7/41; G01S 7/00; G01S 13/00; G01S 13/02; G06N 20/00; H04W 72/00
See application file for complete search history.

(56) References Cited

U.S. PATENT DOCUMENTS 10,705,185 B1 * 7/2020 Lien .................. G01S 7/412
2009/0072912 A1 * 3/2009 Kim .................. H03L 7/1072
331/16

(Continued)

*Primary Examiner* — Hugo Molina
(74) *Attorney, Agent, or Firm* — Winston Hsu

(57) ABSTRACT

A gesture recognition system includes a transmission unit, a first reception chain, a second reception chain, a customized gesture collection engine and a machine learning accelerator. The transmission unit is used to transmit a transmission signal to detect a gesture. The first reception chain is used to receive a first signal and generate first feature map data corresponding to the first signal. The second reception chain is used to receive a second signal and generate second feature map data corresponding to the second signal. The first signal and the second signal are generated by the gesture reflecting the transmission signal. The customized gesture collection engine is used to generate gesture data according to at least the first feature map data and the second feature map data. The machine learning accelerator is used to perform machine learning with the gesture data.

12 Claims, 2 Drawing Sheets

(51) Int. Cl.

| | |
|---|---|
| *G01S 13/02* | (2006.01) |
| *H04W 72/00* | (2009.01) |
| *G06N 20/00* | (2019.01) |
| *G06K 9/00* | (2006.01) |
| *G06K 9/62* | (2006.01) |
| *G01S 13/89* | (2006.01) |
| *G06K 9/20* | (2006.01) |
| *G06K 9/46* | (2006.01) |
| *G06F 9/50* | (2006.01) |
| *G06N 3/08* | (2006.01) |
| *H03B 21/02* | (2006.01) |
| *G01S 13/58* | (2006.01) |
| *G06T 7/20* | (2017.01) |
| *G06F 17/18* | (2006.01) |
| *G01S 13/50* | (2006.01) |
| *G01S 7/35* | (2006.01) |

(52) U.S. Cl.
CPC ............... *G06T 2207/20081* (2013.01); *G06T 2207/20084* (2013.01)

(56) References Cited

U.S. PATENT DOCUMENTS

| | | | |
|---|---|---|---|
| 2016/0050676 A1* | 2/2016 | Sinnaduray | H04L 5/00 370/329 |
| 2019/0049558 A1* | 2/2019 | Yung | G01S 7/412 |

\* cited by examiner

# CUSTOM GESTURE COLLECTION AND RECOGNITION SYSTEM HAVING MACHINE LEARNING ACCELERATOR

CROSS REFERENCE TO RELATED APPLICATIONS

This application claims priority to provisional Patent Application No. 62/626,147, filed 2018 Feb. 4, and incorporated herein by reference in its entirety.

BACKGROUND OF THE INVENTION

1. Field of the Invention

The disclosure relates to a gesture collection and recognition system, and more particularly, a custom gesture collection and recognition system having a machine learning accelerator.

2. Description of the Prior Art

With the development of electronic product technology, communications between a user and a machine has become an increasingly important technical issue.

Common input methods include touching a touch screen, voice control, using a stylus, and so on. Although the above methods are usable, there are still many limitations.

For example, a user still needs to touch the device or make a sound, and the application also has a limitation on the distance. Moreover, the above approaches are not easy to be implemented for applications related to games or more complex controls.

In view of this, it has been proposed to perform control using gesture detection. However, it is often difficult to recognize gestures correctly. It is often not allowed to set customized gestures for a user.

SUMMARY OF THE INVENTION

An embodiment provides a gesture recognition system including a transmission unit, a first reception chain, a second reception chain, a customized gesture collection engine and a machine learning accelerator. The transmission unit is configured to transmit a transmission signal to detect a gesture. The first reception chain is configured to receive a first signal and generate first feature map data corresponding to the first signal, wherein the first signal is generated by the gesture reflecting the transmission signal. The second reception chain is configured to receive a second signal and generate second feature map data corresponding to the second signal. The second signal is generated by the gesture reflecting the transmission signal. The customized gesture collection engine is configured to generate gesture data according to at least the first feature map data and the second feature map data. The customized gesture collection engine includes a first terminal coupled to the first reception chain and configured to receive the first feature map data, a second terminal coupled to the second reception chain and configured to receive the second feature map data, and an output terminal configured to output the gesture data corresponding to at least the first feature map data and the second feature map data. The machine learning accelerator is configured to perform machine learning with the gesture data. The machine learning accelerator comprises an input terminal coupled to the output terminal of the customized gesture collection engine and configured to receive the gesture data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
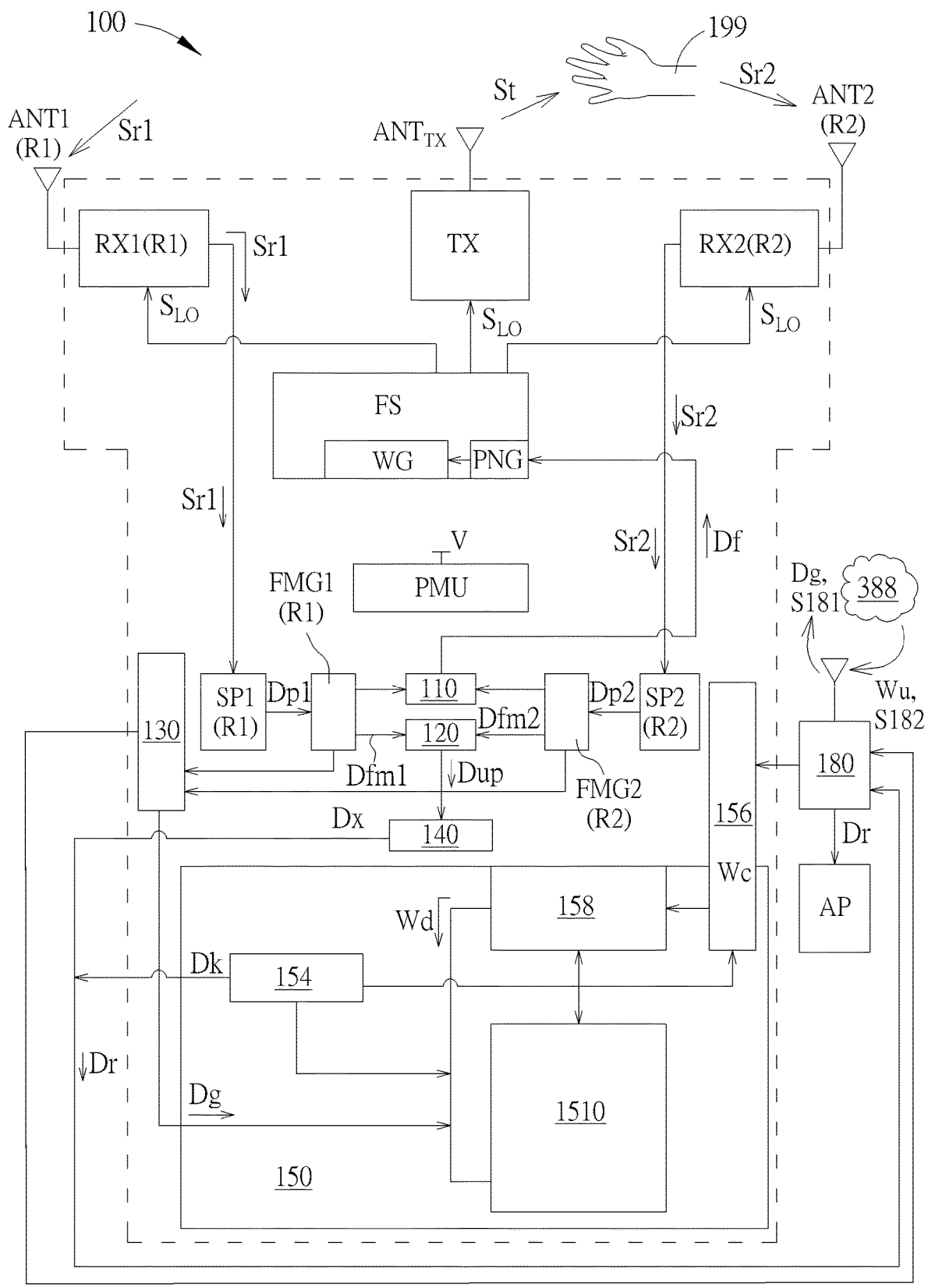
FIG. 1 illustrates a gesture recognition system according to an embodiment.

FIG. 1 illustrates a gesture recognition system 100 according to an embodiment. The gesture recognition system 100 may include a transmission unit TX, a first reception chain R1, a second reception chain R2, a customized gesture collection engine 130, and a machine learning accelerator 150.

The transmission unit TX may be used to transmit a transmission signal St to detect a gesture 199. The first reception chain R1 may be used to receive a first signal Sr1 and generate first feature map data Dfm1 corresponding to the first signal Sr1, where the first signal Sr1 may be generated by the gesture 199 reflecting the transmission signal St. The second reception chain R2 may be used to receive a second signal Sr2 and generate second feature map data Dfm2 corresponding to the second signal Sr2, where the second signal Sr2 may be generated by the gesture 199 reflecting the transmission signal St.

The customized gesture collection engine 130 may be used to generate gesture data Dg according to at least the first feature map data Dfm1 and the second feature map data Dfm2. The customized gesture collection engine 130 may include a first terminal coupled to the first reception chain R1 and used to receive the first feature map data Dfm1, a second terminal coupled to the second reception chain R2 and used to receive the second feature map data Dfm2, and an output terminal used to output the gesture data Dg corresponding to at least the first feature map data Dfm1 and the second feature map data Dfm2.

The machine learning accelerator 150 may be used to perform machine learning with the gesture data Dg. The machine learning accelerator 150 may include an input terminal coupled to the output terminal of the customized gesture collection engine 130 and used to receive the gesture data Dg.

As shown in FIG. 1, according to an embodiment, the transmission unit TX may be coupled to an antenna $ANT_{TX}$ used to transmit the transmission signal St. The first reception chain R1 may include but not limited to a first antenna ANT1, a first receiver RX1, a first signal processing engine SP1 and a first feature map generator FMG1. The first antenna ANT1 may be used to receive the first signal Sr1. The first receiver RX1 may include a first terminal coupled to the first antenna ANT1 and used to receive the first signal Sr1, and an output terminal used to output the first signal Sr1. The first signal processing engine SP1 may be used to generate first processed data Dp1 according to the first signal Sr1. The first signal processing engine SP1 may include an input terminal coupled to the output terminal of the first receiver RX1 and used to receive the first signal Sr1, and an output terminal used to output the first processed data Dp1. The first feature map generator FMG1 may be used to generate the first feature map data Dfm1 according to the first processed data Dp1. The first feature map generator FMG1 may include an input terminal coupled to the output terminal of the first signal processing engine SP1 and used to receive the first processed data Dp1, and an output terminal used to output the first feature map data Dfm1.

As shown in FIG. 1, according to an embodiment, the second reception chain R2 may include but not limited to a second antenna ANT2, a second receiver RX2, a second signal processing engine SP2 and a second feature map generator FMG2. The second antenna ANT2 may be used to receive the second signal Sr2. The second receiver RX2 may include a first terminal coupled to the second antenna ANT2 and used to receive the second signal Sr2, and an output terminal used to output the second signal Sr2. The second signal processing engine SP2 may be used to generate second processed data DP2 according to the second signal Sr2. The second signal processing engine SP2 may include an input terminal coupled to the output terminal of the second receiver RX2 and used to receive the second signal Sr2, and an output terminal used to output the second processed data Dp2. The second feature map generator FMG2 may be used to generate the second feature map data Dfm2 according to the second processed data Dp2. The second feature map generator FMG2 may include an input terminal coupled to the output terminal of the second signal processing engine SP2 and used to receive the second processed data Dp2, and an output terminal used to output the second feature map data Dfm2.

As shown in FIG. 1, according to an embodiment, the gesture recognition system 100 may further include a frequency synthesizer FS used to provide a reference oscillation signal $S_{LO}$. In this embodiment, the transmission unit TX may include an input terminal, the first receiver RX1 may further comprise a second terminal, and the second receiver RX2 may further comprise a second terminal. The frequency synthesizer FS may include a first terminal coupled to the second terminal of the first receiver RX1 for outputting the reference oscillation signal $S_{LO}$ to the first receiver RX1, a second terminal coupled to the second terminal of the second receiver RX2 for outputting the reference oscillation signal $S_{LO}$ to the second receiver RX2, and a third terminal coupled to the input terminal of the transmission unit TX for outputting the reference oscillation signal $S_{LO}$ to the transmission unit TX. According to an embodiment, the transmission unit TX may adjust the transmission signal St according to the reference oscillation signal $S_{LO}$, the first reception chain R1 may adjust the first signal Sr1 according to the reference oscillation signal $S_{LO}$. The second reception chain R2 may adjust the second signal Sr2 according to the reference oscillation signal $S_{LO}$.

According to an embodiment, as shown in FIG. 1, the gesture recognition system 100 may further include a clear channel assessment engine 110 used to recognize an unusable frequency band occupied by another device and generate frequency data Df accordingly. By avoiding using the unusable frequency band, collision avoidance may be achieved. The clear channel assessment engine 110 may include a first terminal coupled to the output terminal of the first feature map generator FMG1 and used to receive the first feature map data Dfm1, a second terminal coupled to the output terminal of the second feature map generator FMG2 and used to receive the second feature map data Dfm2, and an output terminal used to output the frequency data Df.

According to an embodiment, as shown in FIG. 1, the frequency synthesizer FS may further comprise a fourth terminal coupled to the output terminal of the clear channel assessment engine 110 for receiving the frequency data Df. The frequency synthesizer FS may be further used to adjust the reference oscillation signal $S_{LO}$ according to the frequency data Df.

According to an embodiment, as shown in FIG. 1, the frequency synthesizer FS may further include a waveform generator WG and a pseudo-noise code generator PNG. The waveform generator WG may be used to generate a waveform for performing a frequency-hopping spread spectrum (FHSS) algorithm. The pseudo-noise code generator PNG may be used to adjust the reference oscillation signal $S_{LO}$ according to the frequency data Df to prevent the frequency synthesizer FS from using the foresaid unusable frequency band.

According to an embodiment, the gesture recognition system 100 may further include a phase extractor 120 used to analyze phases of the first signal Sr1 and the second signal Sr2 according to the first feature map data Dfm1 and the second feature map data Dfm2 so as to generate unwrapped phase data Dup. The phase extractor 120 may include a first terminal coupled to the output terminal of the first feature map generator FMG1, a second terminal coupled to the output terminal of the second feature map generator FMG2, and an output terminal used to output the unwrapped phase data Dup. The gesture recognition system 100 may further include a fine movement sensing engine 140 used to sense fine movement of the gesture 199 according to the unwrapped phase data Dup. The fine movement sensing engine 140 may include an input terminal coupled to the output terminal of the phase extractor 120.

According to an embodiment, as shown in FIG. 1, the machine learning accelerator 150 may further include a weight decompression engine 158, an array processor 1510 and a memory 156. The weight decompression engine 158 may be used to decompress a compressed weight Wc to generate a decompressed weight Wd. The array processor 1510 may be linked to the weight decompression engine 158 and used to receive the decompressed weight Wd and the gesture data Dg, and recognize the gesture 199 using a recognition algorithm according to the decompressed weight Wd and the gesture data Dg. The memory 156 may be linked to the weight decompression engine 158 and used to store the compressed weight Wc. Because the weights stored in the memory 156 are compressed, the required storage space may be decreased.

According to an embodiment, as shown in FIG. 1, the machine learning accelerator 150 may further include a machine learning hardware acceleration scheduler 154 linked to an host processing unit 180 and the array processor 1510 and used to act as an interface between the array processor 1510 and the host processing unit 180. For example, the host processing unit 180 may be a microcontroller unit (MCU) operating a related program such as a mobile app for gesture recognition. The host processing unit 180 may also be used to send data to a cloud server 388 for weight training.

According to an embodiment, as shown in FIG. 1, the gesture data Dg may be transmitted to the cloud server 388 to be trained by the cloud server 388 for generating an updated weight Wu. The updated weight Wu may be transmitted to the memory 156 to update the compressed weight Wc. Then, the updated weight Wu stored in the memory 156 may be decompressed, and the machine learning accelerator 150 may use the gesture data Dg and the decompressed updated weight Wu to perform calculations for gesture recognition. By means of the trainings performed on the cloud server 388, the weights used by the machine learning accelerator 150 may be timely updated and adjusted, and the accuracy and correctness of gesture recognition may be improved. Furthermore, customized gesture setting and training may be realized.

According to an embodiment, as shown in FIG. 1, the gesture recognition system 100 may further include a host processing unit 180 linked to the memory 156, the customized gesture collection engine 130 and the cloud server 388. The host processing unit 180 may be used to transmit the gesture data Dg to the cloud server 388 and receive the updated weight Wu from the cloud server 388. As shown in FIG. 1, the data sent to the cloud server 388 may be carried by a signal S181, the data sent from the cloud server 388 may be carried by a signal S182. The host processing unit 180 may be linked to the cloud server 388 through a wired path and/or a wireless path. Regarding the compressed weight Wc, the decompressed weight Wd and the updated weight Wu, each of the weights may stand for a set of weights.

As shown in FIG. 1, the fine movement sensing engine 140 may include an output terminal coupled to the host processing unit 180 for sending position data Dx, where the position data Dx is corresponding to a position of the gesture 199 detected by a radar. The position data Dx may relate to a set of coordinate values of the gesture 199. The position data Dx may be used for tracking the gesture 199 and be corresponding to a set of coordinate values related to the position of the gesture 199. The data sent to the host processing unit 180 may be recognition data Dr. The host processing unit 180 may send the recognition data Dr to an application AP to use the recognition data Dr, where the recognition data Dr may include the position data Dx and/or data Dk from the machine learning hardware acceleration scheduler 154. The data Dk may relate to a gesture recognition result such as determining the gesture 199 as a specific gesture. The application AP may track the gesture 199 position according to the recognition data Dr.

According to an embodiment, the data Dk sent from the machine learning hardware acceleration scheduler 154 to the host processing unit 180 may be processed by the host processing unit 180 to be sent to the application AP for the application AP to use the gesture 199. The host processing unit 180 may be installed or formed on a circuit board or a mainboard. The host processing processor 180 may send recognized gesture or recognized position data of the gesture 199 to the application AP. The application AP may include a dedicated software run on a device or a device running a dedicated software.

According to an embodiment, the gesture recognition system 100 may further include a power management unit PMU for receiving a voltage V. The functional blocks described above and shown in FIG. 1 may be implemented using hardware, software and/or firmware. The functional blocks described above may be formed separately or be combined with one another. The terminals of the functional blocks used for signal/data transmission shown in FIG. 1 are merely examples instead of limiting the disclosure, and reasonable adjustment and modification are still in the scope of embodiments.

According to an embodiment, by means of the gesture recognition system 100 described above, an anti-jamming/collision avoidance system may be realized. According to an embodiment, the gesture recognition system 100 may include an FHSS (Frequency-hopping Spread Spectrum) FMCW (Frequency modulated continuous waveform) radar system for hand/finger gesture recognition application using a hardware DNN (Deep Neural Network) accelerator (e.g. the machine learning accelerator 150) and a customizable gesture training platform. The system 100 may process signals of high frequency such as 60 GHz. The system 100 may have fine movement sensing capability by means of the fine movement sensing engine 140. The system 100 may be implemented as an SoC (System on Chip), a chipset, or an integrated device having at least a chip and other elements which may be connected via a circuit board.

For example, anti-jamming/collision avoidance may be achieved by turning on the two receivers RX1 and RX2 to sweep a frequency spectrum first. For example, the swept frequency spectrum may be the entire 57-67 GHz spectrum. The system 100 may skip the portions of spectrum occupied by other users/devices so as to avoid collision. On top of avoidance of collision, FHSS may also be used to further reduce such occurrence on a statistical basis. This anti-jamming/collision avoidance algorithm may be done on a Frame to Frame basis. The entire algorithm for gesture recognition may be based on Machine Learning and Deep Neural Network (ML and DNN). The ML/DNN related circuit such as the machine learning accelerator 150 may receive outputs from the feature map generators FMG1 and FMG2 and form "frames" for gesture recognition. Because of the computational workload and real time, low latency requirement, the recognition algorithm is realized with a special hardware array processor (such as the array processor 1510). A dedicated Scheduler (e.g. a machine learning hardware accelerator scheduler 154) may act as an interface between the array processor 1510 and an MCU (e.g. the host processing unit 180). Furthermore, since special compression algorithm may be applied to reduce memory requirement for weights, a special decompression engine (e.g. the weight decompressor engine 158) may be used to process the compressed weight (e.g. the compressed weight Wc) first before feeding to the accelerator 150. In the system 100, the machine learning accelerator 150 may be used for gesture detection recognition dedicatedly and may be disposed in the proposed system locally according to an embodiment. The system 100 may be a stand-alone system which is able to operate for gesture recognition independently. Hence, it is more convenient to integrate the proposed system into another device (e.g. a mobile phone, a tablet, a computer, etc.), and engineering efficiency may also be improved. For example, the time and/or power consumption required for gesture recognition may be reduced. The machine learning accelerator (e.g. 150) may be used to reduce the required gesture processing time at the system 100, and the weights used by the machine learning accelerator (e.g. 150) may be obtained from gesture training. Gesture training may be performed by a remote ML server such as the cloud server 388.

As a typical application scenario, a fixed number of gestures may be collected and used for training. Gesture recognition using a plurality of weights may be improved by performing training using a set of collected gestures. For example, a single gesture may be performed by one thousand persons so as to generate one thousand samples, and these one thousand samples may then be processed by a cloud ML server (e.g. the cloud server 388). The cloud ML server may perform gesture training using these samples so as to obtain a corresponding result. The result may be a set of weights used in the gesture inference process. Therefore, when a user performs a gesture, this set of weights may be employed in the calculation process to enhance recognition performance.

A basic set of gestures may therefore be realized using this trained set of weights. In addition, the system 100 may allow a user to have customized gestures. A user's personal gesture may be recorded and then sent to the Cloud ML server (e.g. the cloud server 388) via an external host processor (e.g. the host processing unit 180) for subsequent gesture training. The external host processor (e.g. the host processing unit 180) may run a customized gesture collection application program and may be connected to the Cloud server via an internet network through wire or wirelessly. The results of training (e.g. the updated weight Wu) may then be downloaded so the user's own gesture may be used as well.

As mentioned above, signals used for gesture sensing may have frequency in the 60 GHz range. Due to its corresponding millimeter wavelength, the proposed system may detect minute hand/finger movement with millimeter accuracy. Special processing of phase information for radar signal may be required. A special phase processing engine (e.g. a phase extractor/unwrapper such as the phase extractor 120) in FIG. 1 may be used for such purpose.

Figure 2:
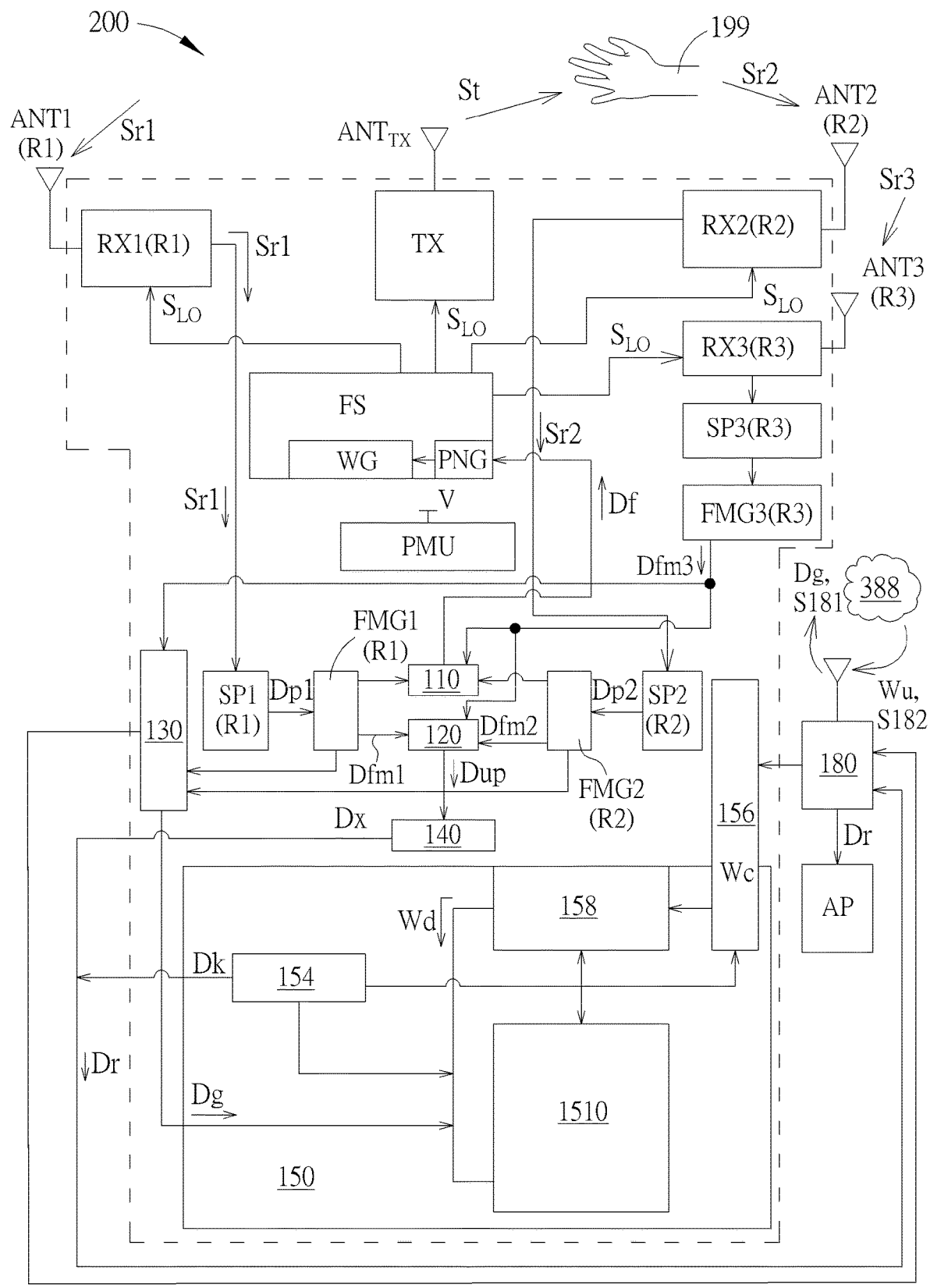
FIG. 2 illustrates a gesture recognition system according to another embodiment.

In FIG. 1, two reception chains (e.g. the first reception chain R1 and the second reception chain R2) are used. According to another embodiment, more reception chain may be used for receiving more signals reflected by the gesture 199. FIG. 2 illustrates a gesture recognition system 200 according to an embodiment. Compared with FIG. 1, FIG. 2 may further include a third reception chain R3 used to receive a third signal Sr3 and generate third feature map data Dfm3 corresponding to the third signal Sr3. The third signal Sr3 may be generated by the gesture 199 reflecting the transmission signal St. The customized gesture collection engine 130 in FIG. 2 may be used to generate the gesture data Dg according to the first feature map data Dfm1, the second feature map data Dfm2 and the third feature map data Dfm3. The customized gesture collection engine 130 in FIG. 2 may further comprise a third terminal coupled to the third reception chain R3 and used to receive the third feature map data Dfm3. The gesture data Dg in FIG. 2 may be corresponding to the first feature map data Dfm1, the second feature map data Dfm2 and the third feature map data Dfm3. With more reception chains, more dimensional knowledge may be used to enhance both tracking accuracy and recognition accuracy. Like the reception chains R1 and R2, the third chain R3 in FIG. 2 may also include a third antenna ANT3, a third receiver RX3, a third signal processing engine SP3 and a third feature map generator FMG3, and it is not repeatedly described.

In summary, by means of a gesture recognition system provided by an embodiment, an anti-jamming and collision avoidance system may be implemented. The accuracy and correctness of gesture recognition may be improved by means of machine learning. It is also allowed to set customized gestures for a user and the customized gestures can be also trained in a server for better user experience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A gesture recognition system comprising:
   a transmission unit configured to transmit a transmission signal to detect a gesture;
   a first reception chain configured to receive a first signal and generate first feature map data corresponding to the first signal, wherein the first signal is generated by the gesture reflecting the transmission signal;
   a second reception chain configured to receive a second signal and generate second feature map data corresponding to the second signal, wherein the second signal is generated by the gesture reflecting the transmission signal;
   a customized gesture collection engine configured to generate gesture data according to at least the first feature map data and the second feature map data, the customized gesture collection engine comprising a first terminal coupled to the first reception chain and configured to receive the first feature map data, a second terminal coupled to the second reception chain and configured to receive the second feature map data, and an output terminal configured to output the gesture data corresponding to at least the first feature map data and the second feature map data; and
   a machine learning accelerator configured to perform machine learning with the gesture data, the machine learning accelerator comprising an input terminal coupled to the output terminal of the customized gesture collection engine and configured to receive the gesture data.

2. The gesture recognition system of claim 1, wherein:
the first reception chain comprises:
   a first antenna configured to receive the first signal;
   a first receiver comprising a first terminal coupled to the first antenna and configured to receive the first signal, and an output terminal configured to output the first signal;
   a first signal processing engine configured to generate first processed data according to the first signal, the first signal processing engine comprising an input terminal coupled to the output terminal of the first receiver and configured to receive the first signal, and an output terminal configured to output the first processed data; and
   a first feature map generator configured to generate the first feature map data according to the first processed data, the first feature map generator comprising an input terminal coupled to the output terminal of the first signal processing engine and configured to receive the first processed data, and an output terminal configured to output the first feature map data; and the second reception chain comprises:
   a second antenna configured to receive the second signal;
   a second receiver comprising a first terminal coupled to the second antenna and configured to receive the second signal, and an output terminal configured to output the second signal;
   a second signal processing engine configured to generate second processed data according to the second signal, the second signal processing engine comprising an input terminal coupled to the output terminal of the second receiver and configured to receive the second signal, and an output terminal configured to output the second processed data; and
   a second feature map generator configured to generate the second feature map data according to the second processed data, the second feature map generator comprising an input terminal coupled to the output terminal of the second signal processing engine and configured to receive the second processed data, and an output terminal configured to output the second feature map data.

3. The gesture recognition system of claim 2 further comprising:
   a frequency synthesizer configured to provide a reference oscillation signal;
   wherein:
   the transmission unit comprises an input terminal;
   the first receiver further comprises a second terminal;
   the second receiver further comprises a second terminal;
   the frequency synthesizer comprises a first terminal coupled to the second terminal of the first receiver for outputting the reference oscillation signal to the first receiver, a second terminal coupled to the second terminal of the second receiver for outputting the reference oscillation signal to the second receiver, and a third terminal coupled to the input terminal of the transmission unit for outputting the reference oscillation signal to the transmission unit; and
   the transmission unit adjusts the transmission signal according to the reference oscillation signal, the first reception chain adjusts the first signal according to the reference oscillation signal, and the second reception chain adjusts the second signal according to the reference oscillation signal.

4. The gesture recognition system of claim 3 further comprising:
   a clear channel assessment engine configured to recognize an unusable frequency band occupied by another device and generate frequency data accordingly, the clear channel assessment engine comprising a first terminal coupled to the output terminal of the first feature map generator and configured to receive the first feature map data, a second terminal coupled to the output terminal of the second feature map generator and configured to receive the second feature map data, and an output terminal configured to output the frequency data.

5. The gesture recognition system of claim 4, wherein the frequency synthesizer further comprises a fourth terminal coupled to the output terminal of the clear channel assessment engine for receiving the frequency data, and the frequency synthesizer is further configured to adjust the reference oscillation signal according to the frequency data.

6. The gesture recognition system of claim 4, wherein the frequency synthesizer further comprises a waveform generator configured to generate a waveform for performing a frequency-hopping spread spectrum (FHSS) algorithm, and a pseudo-noise code generator configured to adjust the reference oscillation signal according to the frequency data to avoid the frequency synthesizer from using the unusable frequency band.

7. The gesture recognition system of claim 2 further comprising:
   a phase extractor configured to analyze phases of the first signal and the second signal according to the first feature map data and the second feature map data so as to generate unwrapped phase data, the phase extractor comprising a first terminal coupled to the output terminal of the first feature map generator, a second terminal coupled to the output terminal of the second feature map generator, and an output terminal configured to output the unwrapped phase data; and
   a fine movement sensing engine configured to sense fine movement of the gesture according to the unwrapped phase data, the fine movement sensing engine comprising an input terminal coupled to the output terminal of the phase extractor.

8. The gesture recognition system of claim 1, wherein:
   the machine learning accelerator further comprises:
      a weight decompression engine configured to decompress a compressed weight to generate a decompressed weight;
      an array processor linked to the weight decompression engine and configured to receive the decompressed weight and the gesture data, and recognize the gesture using a recognition algorithm according to the decompressed weight and the gesture data; and
      a memory linked to the weight decompression engine and configured to store the compressed weight.

9. The gesture recognition system of claim 8, wherein:
   the machine learning accelerator further comprises:
      a machine learning hardware acceleration scheduler linked to a host processing unit and the array processor, and configured to act as an interface between the array processor and the host processing unit.

10. The gesture recognition system of claim 8, wherein the gesture data is transmitted to a cloud server to be trained by the cloud server for generating an updated weight, and the updated weight is transmitted to the memory to update the compressed weight.

11. The gesture recognition system of claim 10, further comprising:
   a host processing unit linked to the memory, the customized gesture collection engine and the cloud server, and configured to transmit the gesture data to the cloud server and receive the updated weight from the cloud server.

12. The gesture recognition system of claim 1, further comprising:
   a third reception chain configured to receive a third signal and generate third feature map data corresponding to the third signal, wherein the third signal is generated by the gesture reflecting the transmission signal;
   wherein the customized gesture collection engine is configured to generate the gesture data according to the first feature map data, the second feature map data and the third feature map data, the customized gesture collection engine further comprises a third terminal coupled to the third reception chain and configured to receive the third feature map data, and the gesture data is corresponding to the first feature map data, the second feature map data and the third feature map data.

* * * * *